United States Patent
Vogelsang et al.

(10) Patent No.: US 12,217,784 B2
(45) Date of Patent: Feb. 4, 2025

(54) BOOSTED WRITEBACK VOLTAGE

(71) Applicant: Rambus Inc., Sunnyvale, CA (US)

(72) Inventors: Thomas Vogelsang, Mountain View, CA (US); Brent S. Haukness, Sunnyvale, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 17/909,940

(22) PCT Filed: Mar. 8, 2021

(86) PCT No.: PCT/US2021/021328
§ 371 (c)(1),
(2) Date: Sep. 7, 2022

(87) PCT Pub. No.: WO2021/188316
PCT Pub. Date: Sep. 23, 2021

(65) Prior Publication Data
US 2024/0203474 A1    Jun. 20, 2024

Related U.S. Application Data

(60) Provisional application No. 62/991,829, filed on Mar. 19, 2020.

(51) Int. Cl.
*G11C 11/4091*    (2006.01)
*G11C 11/406*     (2006.01)
*G11C 11/4094*    (2006.01)

(52) U.S. Cl.
CPC ... *G11C 11/40611* (2013.01); *G11C 11/40626* (2013.01); *G11C 11/4091* (2013.01); *G11C 11/4094* (2013.01)

(58) Field of Classification Search
CPC ......... G11C 11/40611; G11C 11/40626; G11C 11/4091; G11C 11/4094
See application file for complete search history.

(56) References Cited

U.S. PATENT DOCUMENTS

| | | | |
|---|---|---|---|
| 4,239,993 A | 12/1980 | McAlexander, III et al. |
| 4,855,628 A | 8/1989 | Jun |

(Continued)

FOREIGN PATENT DOCUMENTS

WO    WO-2020-112884 A1    6/2020

OTHER PUBLICATIONS

Kotabe, Akira et al., "Asymmetric Cross-Coupled Sense Amplifier for Small-Sized 0.5-V Gigabit-DRAM Arrays", IEEE Asian Solid-State Circuits Conference, Nov. 8-10, 2010, Beijing, China, 4 Pages.

(Continued)

*Primary Examiner* — Son L Mai
(74) *Attorney, Agent, or Firm* — The Neudeck Law Firm, LLC

(57) ABSTRACT

The dynamic memory array of a DRAM device is operated using at least two voltages. The first voltage, which is used to power the sense amplifiers during sense (i.e., read) operations and most other column operations (e.g., precharge, activate, write), is the operating (i.e., switching) voltage of a majority of the digital logic circuitry of the DRAM device. The second voltage, which determines the voltage written to the capacitor of the DRAM cells (i.e., bitline voltage) is greater than the operating (i.e., switching) voltage of a majority of the digital logic circuitry of the DRAM device. The digital logic circuitry is operated using a supply voltage that is lower than the voltage written to the capacitors of the DRAM array. This allows lower voltage swing digital logic to be used for a majority of the logic on the DRAM device while writing a larger voltage to the DRAM cells.

20 Claims, 12 Drawing Sheets

(56) References Cited

U.S. PATENT DOCUMENTS

| | | | |
|---|---|---|---|
| 4,980,862 A | 12/1990 | Foss | |
| 5,933,386 A * | 8/1999 | Walker | G11C 7/12 |
| | | | 365/185.23 |
| 6,347,058 B1 * | 2/2002 | Houghton | G11C 11/4094 |
| | | | 365/204 |
| 6,952,377 B2 | 10/2005 | Chung | |
| 8,873,321 B2 * | 10/2014 | Katoch | G11C 5/147 |
| | | | 365/207 |
| 9,293,556 B2 * | 3/2016 | van Bentum | H01L 29/516 |
| 9,406,355 B1 * | 8/2016 | Chang | G11C 7/065 |
| 2012/0243360 A1 * | 9/2012 | Ferrant | G11C 11/4097 |
| | | | 365/207 |
| 2016/0322104 A1 | 11/2016 | Siau et al. | |

OTHER PUBLICATIONS

Lu, Nicky et al., "Enhance Core Circuits for Scaling Dram: 0.7V VCC with Long Retention 138ms at 125degreesC and Random Row/Column Access Times Accelerated by 1.5ns", 2021 Symposia on VISI Technology Circuits, Kyoto. 28 pages.

Notification of Transmittal of the International Search Report and the Written Opinion of the International Searching Authority, or the Declaration with Mail Date May 25, 2021 re: Int'l Appln. No. PCT/US2021/021328. 10 pages.

Pyo, Suk-Soo et al., "A 0.65V Embedded SDRAM With Smart Boosting and Power Management in a 45nm CMOS Technology", IEEE, 2012. 4 Pages.

* cited by examiner

BOOSTED WRITEBACK VOLTAGE

DETAILED DESCRIPTION OF THE EMBODIMENTS

Reducing power consumption of electronics and computer systems is an ongoing goal. Accordingly, reducing the power consumption of dynamic random access memory (DRAM) devices is part of that effort. The main contributors to the power consumption of DRAM devices are associated with the formula $P=CV^2f$, where P is power consumption, C is capacitance, V is the switching voltage, and f is the switching frequency. Thus, because the voltage is squared in the preceding formula, reducing the switching voltage can have an important effect on reducing the power consumption.

In an embodiment, the dynamic memory array(s) of a DRAM device are operated using at least two voltages. The first voltage, which is used to power the sense amplifiers during sense (i.e., read) operations and most other column operations (e.g., precharge, activate, write), is the operating (i.e., switching) voltage of a majority of the digital logic circuitry of the DRAM device. The second voltage, which determines the voltage written to the capacitor of the DRAM cells (i.e., bitline voltage) is greater than the operating (i.e., switching) voltage of a majority of the digital logic circuitry of the DRAM device. In other words, the digital logic circuitry is operated using a supply voltage that is lower than the voltage written to the capacitors of the DRAM array. This allows lower voltage swing (and thus lower power) digital logic to be used for a majority of the logic on the DRAM device while writing a larger voltage to the DRAM cells for retention time purposes. The lower voltage swing used by the majority of the logic reduces the power consumption of the sense amplifiers of the DRAM array and the other digital logic of the DRAM which, in turn, reduces the power consumption of the DRAM device as a whole.

Figure 1:
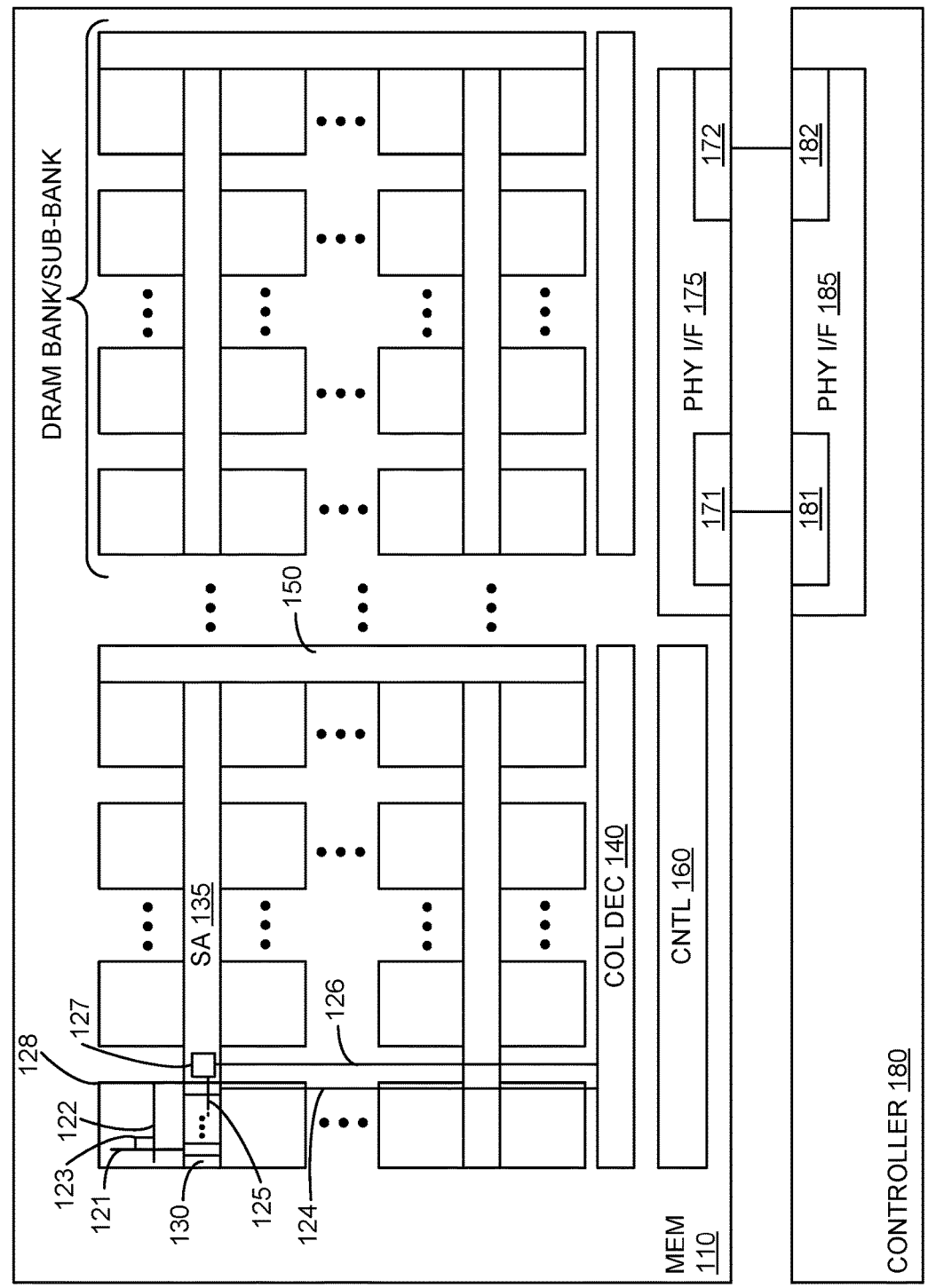
FIG. 1 is a block diagram illustrating a dynamic random access memory (DRAM) system according to an embodiment.

FIG. 1 is a block diagram illustrating a dynamic random access memory (DRAM) system according to an embodiment. In FIG. 1, memory system 100 includes DRAM memory device 110 and controller 180. Controller 180 and memory device 110 are integrated circuit type devices, such as are commonly referred to as a "chips". A memory controller, such as controller 180, manages the flow of data going to and from memory devices. A memory controller can be a separate, standalone chip, or integrated into another chip. For example, a memory controller may be included on a single die with a microprocessor, or included as part of a more complex integrated circuit system such as a block of a system on a chip (SOC).

Controller 180 includes physical interface 185. Physical interface 185 includes command/address (CA) interface 181 and bidirectional data (DQ) interface 182. Memory device 110 includes physical interface circuitry 175. Physical interface circuitry 175 includes command/address (CA) interface 171 and bidirectional data (DQ) interface 172. Command/address interface 181 of controller 180 is operatively coupled to CA interface 171 of memory device 110 to send commands and addresses to memory device 110. Controller 180 is operatively coupled to memory device 110 via bidirectional data interface 182. Controller 180 is operatively coupled to memory device 110 to communicate data with memory device 110. Memory device 110 communicate data via bidirectional data interface 172.

In FIG. 1, DRAM memory device 110 includes multiple banks/sub-banks, control circuitry 160 and interface circuitry 175. DRAM memory device 110 may be, be on, or comprise at least one integrated circuit. The DRAM banks include subarrays (e.g., subarray 128), sense amplifier stripes (e.g., sense amplifier stripes 135), column decode 140, and wordline control circuitry 150. The sense amplifier stripes 135 include sense amplifiers (e.g., sense amplifier 130) and local-global switches (e.g., local-global switch 127). The subarrays include memory bit cells (e.g., cell 123). The memory bit cells 123 connect to wordlines 122, bitlines 121, and column select lines 124. The sense amplifiers 130 connect to bitlines 121 and local data lines 125. Local-global switches 127 connect to local data lines 125 and global data lines 126.

Control circuitry 160 is operatively coupled to the DRAM banks to process at least column addresses, row addresses, and/or commands received via CA interface 171. Control circuitry 160 is comprised of digital logic circuitry that operates, in a normal operating mode, using a selected (e.g., by the manufacturer of DRAM memory device 110) digital logic supply voltage (a.k.a., VDD.) Control circuitry 160 may comprise a majority of circuitry implemented using complementary metal-oxide-semiconductor (CMOS) type logic gates. Control circuitry 160 may comprise a circuitry implemented using CMOS logic implemented in a high-K/metal gate (HKMG) CMOS fabrication process. The signal swings (i.e., between a logical '1' and a logical '0') of full-swing CMOS logic gates may range from a minimum corresponding to the negative supply/reference/substrate voltage up to a maximum voltage corresponding to the digital logic supply voltage.

In an embodiment, DRAM memory device 110 (and sense amplifiers 130, in particular), in a normal operating mode (i.e., a non-test mode), senses the state of memory bit cells (e.g., cell 123) using the digital logic supply and/or maximum signal swing level (with respect to the same negative supply/reference/substrate voltage as the bitline voltage is referenced to) of a majority of the digital logic on DRAM memory device 110.

When writing data to the memory bit cells (e.g., cell 123), however, DRAM device (and sense amplifiers 130, in particular) may charge bitlines to a voltage (i.e., maximum voltage with respect to the negative supply/reference/substrate voltage) that is higher than the digital logic supply and/or maximum signal swing level (with respect to the same negative supply/reference/substrate voltage as the bitline voltage is referenced to) of a majority of the digital logic on DRAM memory device 110. In particular, during write and writeback operations, bitlines 121 may be charged using a maximum voltage that is greater than control circuitry 160. For brevity, this boosted bitline voltage may be referred to herein as VBLHI.

A normal operating (non-test) mode includes the expected operating modes for DRAM memory device 110 in a memory system 100 that is being used in a non-production and non-test environment. For example, DRAM memory device 110 may be tested or otherwise operated in one or more test mode before being included in a larger system (e.g., completed computer system, consumer electronic device, etc.) These test modes may be used during various manufacturing processes and/or stages, but are typically not used while the system is being used by an end user (e.g., consumer, data center, etc.)

Test modes may be used, for example, at times, such as during burn-in, to 'stress' DRAM device 110 in order to confirm the functioning and/or reliability of DRAM device 110. Likewise, the digital logic supply voltage may be lowered below the boosted bitline voltage during testing to confirm the functioning and/or reliability of DRAM memory device 110. However, test modes are not typically used during 'normal' operation because the functioning, performance, lifetime, and/or reliability of DRAM device 110 may be degraded while being operating in one or more test modes (as opposed to 'normal' operating modes.)

Sense amplifier stripes 135 and the sense amplifiers therein (e.g., sense amplifier 130) may be operated, in a normal operating mode, using a selected (e.g., by the manufacturer) boosted bitline voltage (and/or bitline voltage range). Wordline control circuitry 150 may be operated, in a normal operating mode, using the digital logic supply voltage and/or a separate programming power supply voltage (VPP) that may be present to support word line voltage requirements that are compatible with the boosted bitline voltage. Column decode 140 may be operated, in a normal operating mode, using the digital logic supply voltage. Control circuitry (and included datapath circuitry) 160 may be operated, in a normal operating mode, using the digital logic supply voltage. Interface circuitry 175 may be operated, in a normal operating mode, using an input/output (I/O) supply voltage and/or the digital logic supply voltage.

In an embodiment, control circuitry 160, column decode 140, and row decode 150 collectively at least processes column addresses and row addresses to retrieve data stored in at least subarray 128. Control circuitry 160, column decode 140, and row decode 150 operate using a digital logic supply voltage. Sense amplifiers 130 also operate using the digital logic supply voltage during sense operations and column operations. Sense amplifiers 130 also operate, during writeback operations, using a boosted bitline voltage that is greater than the first digital logic supply voltage. Control circuitry 160, column decode 140, and/or row decode 150 may be implemented using a high-k metal gate process.

Sense amplifiers 130 include a pair of cross-coupled inverters in a bi-stable flip-flop configuration coupled to respective bitlines of the dynamic memory array. These cross-coupled inverters each having a negative supply node and a positive supply node. During writeback operations, the boosted bitline voltage may be selectively coupled to the positive supply node of the cross-coupled inverters. This causes the sense amplifier circuits to charge the cells 123 of the array to the boosted bitline voltage rather than the digital logic supply voltage. Increasing the voltage that cells 123 are charged with increases the cells 123 data retention time when compared to charging the cells 123 with the digital logic supply voltage.

In an embodiment, the digital logic supply voltage is selectively coupled to the positive supply node of the cross-coupled inverters during sense operations and column operations. The digital logic supply voltage is selectively decoupled to from positive supply node of the cross-coupled inverters during writeback operations. In this manner, a drive-fight between the digital logic supply voltage and the boosted bitline voltage is avoided. In an embodiment, the boosted bitline voltage is selectively coupled to the positive supply node of the cross-coupled inverters during refresh operations. In particular, the boosted bitline voltage is selectively coupled to the positive supply node of the cross-coupled inverters during a sense operation without first sensing using the digital logic supply voltage. In this manner, a refresh operation may be completed without waiting for the cross-coupled inverters reaching a stable state using the digital logic supply voltage before beginning to charge the bitlines with the boosted bitline voltage. This may allow the refresh operation to complete in less time than a separate sense operation followed by a separate (boosted) writeback operation.

In an embodiment, the boosted bitline voltage may be based on a command received from controller 180. For example, controller 180 may write a value to a register in control circuitry 160 that sets the boosted bitline voltage. In another example, the command (e.g., refresh, write, etc.) may indicate a boosted bitline voltage (e.g., write with boost, refresh without boost, etc.) In another example, controller 180 may indicate the boosted bitline voltage using a combination of a register in control circuitry 160 and a command that indicates a boosted bitline voltage. In an embodiment, controller 180 may select the boosted bitline voltage based on a temperature of memory device 110. In an embodiment, controller may select the boosted bitline voltage based on a use for the data being sensed. For example, if controller 180 knows that the data is no longer going to be stored in memory device 110, controller 180 may indicate a "read without boosted writeback" command. A "read without boosted writeback" or a "refresh without boosted writeback" command may select a bitline voltage for writeback that is equal to the digital logic supply voltage. These commands may affect (e.g., reduce) the processing time of commands and thereby increase the throughput of memory device 110 when compared to always using a boosted bitline voltage.

In an embodiment, memory device 110 may select the boosted bitline voltage. Memory device 110 may select the boosted bitline voltage based on the temperature of memory device 110. In an embodiment, memory device 110 may select the boosted bitline voltage based on the temperature of memory device 110 and one or more indicators (e.g., register values or commands) received from controller 180. For example, memory device 110 may select the boosted bitline voltage based on the temperature of memory device 110 and a temperature vs. boosted bitline voltage coefficient indicator received from controller 180.

Figure 2:
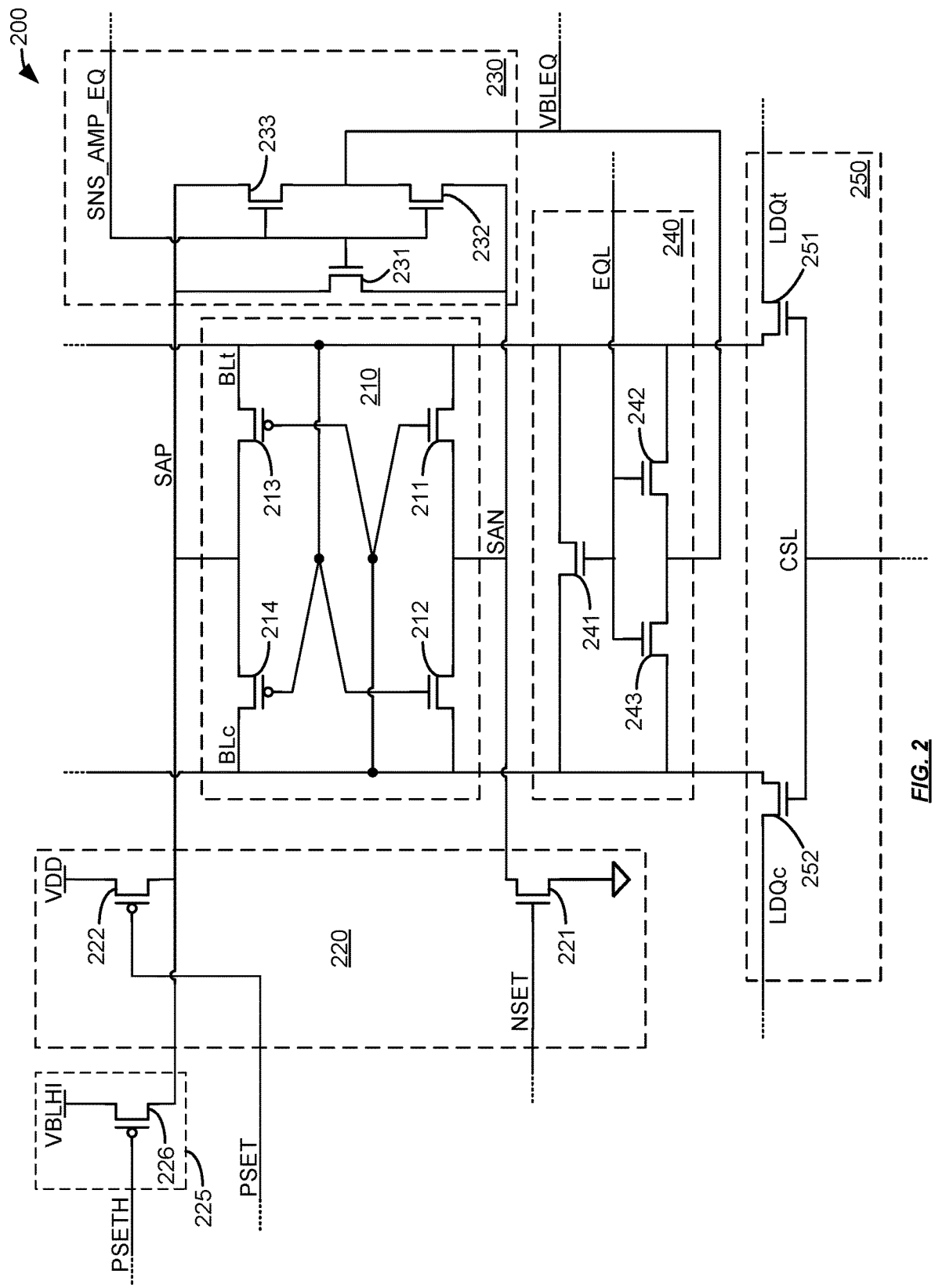
FIG. 2 is a diagram illustrating an example boosted writeback sense amplifier.

FIG. 2 is a diagram illustrating an example boosted writeback sense amplifier. Sense amplifier 200 may be part of DRAM memory device 110 and/or sense amplifier stripes 135 (i.e., as sense amplifier 130, in particular.) In FIG. 2, sense amplifier 200 includes functional blocks 210, 220, 225, 230, 240, and 250. Although illustrated in FIG. 2 as part of one sense amplifier 200, functional blocks 220, 225, 230, 240, and 250 may be shared with multiple amplifier blocks 210 to form multiple sense amplifiers. Similarly, although illustrated in FIG. 2 in proximity to amplifier block 210, functional blocks 220, 225, 230, 240, and 250 may be located at various locations within a DRAM array that are relatively remote to amplifier block 210.

Sense amplifier 200 performs the evaluation of the voltage difference on the true (BLt) and complement (BLc) bitlines. Sense amplifier 200 also performs the writing and/or writeback of data to a memory cell (e.g. cell 123) by forcing (charging) the true (BLt) and complement (BLc) bitlines to either the digital logic supply voltage (VDD) and/or a boosted bitline voltage (VBLHI).

Amplifier block 210 is comprised of a pair of cross-coupled inverters that are switched on by evaluate control block 220. The cross-coupled inverters of amplifier block 210 comprise n-channel field effect transistors (NFETs) 211 and 212, and p-channel field effect transistors (PFETs) 213 and 214. NFET 211 and PFET 214 form a first inverter that is cross-coupled to a second inverter formed using NFET 212 and PFET 214. The outputs of each inverter is provided to the input of the other inverter (i.e., cross-coupled). The negative supply and the positive supply to the inverters of amplifier block 210 are selectively provided by evaluate control block 220 and/or boosted bitline control block 225.

The power supplies SAN and SAP to these inverters are selectively (switchably) provided to amplifier block 210 by evaluate control block 220. The power supply SAP is selectively (switchably) provided to amplifier block 210 by boosted bitline control block 225. The power supplies SAN and SAP to these inverters are selectively (switchably) provided to amplifier block 210 by evaluate control block 220 in order to allow the internal and external nodes of/to amplifier block 210 (including the bitlines BLt and BLc, and power supplies SAN and SAP) to be equalized and then activated to evaluate the voltages on the bitlines BLt and BLc. The power supply SAP is selectively (switchably) provided to amplifier block 210 by boosted bitline control block 225 in order to charge the voltage on an amplifier block 210 state dependent one of the bitlines BLt and BLc to the boosted bitline voltage VBLHI.

Evaluate control block 220 includes NFET 221 and PFET 222. NFET 221, under the control of the signal on the NSET node, switchable connects and disconnects the negative (reference) supply voltage to the node SAN (which is the negative supply for amplifier block 210). PFET 222, under the control of the signal on the PSET node, switchably connects and disconnects the digital logic supply voltage to the node SAP (which is the positive supply for amplifier block 210). The signal provided to the NSET node (i.e., gate of NFET 221) may have a swing that is less than the boosted bitline voltage. Thus, in normal operation, the control circuitry (e.g., control circuitry 160) coupled to evaluate control block 220 may comprise circuitry that can supply the NSET node with a signal that reaches the digital logic supply voltage but does not reach VBLHI (or even reaches VBLHI minus PFET 222's threshold voltage.)

In an embodiment, in normal non-writeback operations, the digital logic supply voltage connected to SAP by PFET 222 is less than the boosted bitline voltage VBLHI. The swing of the signal on PSET (i.e., the gate of PFET 222) may be equal to (or less than a threshold voltage of PFET 222 lower than) the digital logic supply voltage (e.g., VDD) to be connected to SAP. Thus, in normal non-writeback operations, the control circuitry coupled to evaluate control block 220 may comprise circuitry that can supply the PSET node with a signal that reaches the digital logic supply voltage VDD but does not reach VBLHI (or even reaches VBLHI minus PFET 222's threshold voltage.)

Sense amplifier equalize block 230, when activated via a signal on node SNS_AMP_EQ connects SAP and SAN together and to an equalize supply voltage VBLEQ. Sense amplifier equalize block 230 includes NFETs 231-233. The gates of NFETs 231-233 are operatively coupled together and to node SNS_AMP_EQ. The source and drain nodes of NFET 231 are connected to SAN and SAP, respectively. The source and drain nodes of NFET 232 are connected to SAN and VBLEQ, respectively. The source and drain nodes of NFET 233 are connected to VBLEQ and SAP, respectively. The signal provided to SNS_AMP_EQ may have a swing that is less than the boosted bitline voltage VBLHI. Thus, in normal operation, the control circuitry (e.g., control circuitry 160) coupled to sense amplifier equalize block 230 may comprise circuitry that can supply the SNS_AMP_EQ node with a signal that reaches the digital logic supply voltage but does not reach VBLHI (or even does not reach VBLHI minus PFET 222's threshold voltage.)

Bitline equalize block 240, when activated via a signal on node EQL, connects the bitlines BLt and BLc together and to an equalize supply voltage VBLEQ. Bitline equalize block 240 includes NFETs 241-243. The gates of NFETs 241-243 are operatively coupled together and to node EQL. The source and drain nodes of NFET 241 are connected to BLt and BLc, respectively. The source and drain nodes of NFET 242 are connected to BLt and VBLEQ, respectively. The source and drain nodes of NFET 243 are connected to VBLEQ and BLc, respectively. The signal provided to EQL may have a swing that is less than the boosted bitline voltage VBLHI. Thus, in normal operation, the control circuitry (e.g., control circuitry 160) coupled to bitline equalize block 240 may comprise circuitry that can supply the EQL node with a signal that reached the digital logic supply voltage but does not reach VBLHI (or even does not reach VBLHI minus PFET 222's threshold voltage.)

Column connect block 250 selectively (switchably) connects (a.k.a., gates) the bitlines BLt and BLc to local data lines LDQt and LDQc, respectively. Column connect block 250 includes NFETs 251-252. The gates of NFETs 251-252 are operatively coupled together and to node CSL. The source and drain nodes of NFET 251 are connected to BLt and LDQt, respectively. The source and drain nodes of NFET 252 are connected to BLc and LDQt, respectively. The swing of the signal on CSL (i.e., the gates of NFETs 251-252) may be equal to the digital logic supply voltage.

In an embodiment, PFET 226, under the control of the signal on the PSETH node, switchably connects and disconnects the boosted bitline voltage VBLHI to the node SAP. PFET 222, under the control of the signal on the PSET node, switchable disconnects the digital logic supply voltage VDD from the node SAP when PFET 226 connects the boosted bitline voltage VBLHI to the node SAP. To disconnect the digital logic supply voltage VDD from the node SAP, the voltage on the PSET node may be boosted to VBLHI. The disconnection of the digital logic supply voltage VDD from the node SAP avoids a drive-fight between the boosted bitline voltage VBLHI and the digital logic supply voltage VDD. When PFET 226 connects the boosted bitline voltage VBLHI to the node SAP, an amplifier block 210 state selected one of the bitlines BLt and BLc are charged to the boosted bitline voltage VBLHI. In an embodiment, PFET 226 connects the boosted bitline voltage VBLHI to the node SAP to evaluate the voltages on the bitlines BLt and BLc. In this embodiment, PFET 226 may connect the boosted bitline voltage VBLHI to the node SAP without first connecting the digital logic supply voltage VDD to the node SAP.

Figure 3:
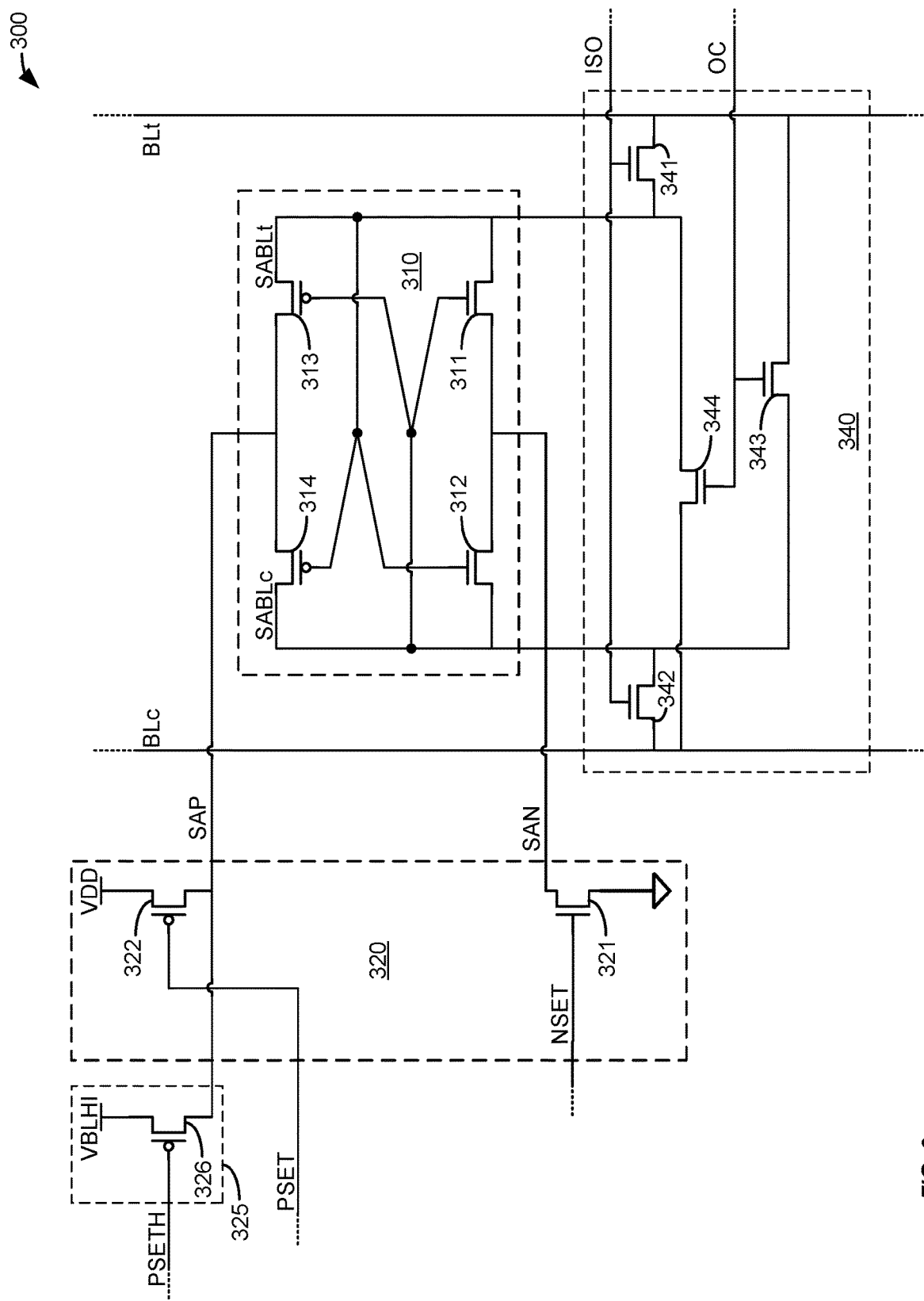
FIG. 3 is a diagram illustrating elements of an offset compensated boosted writeback sense amplifier.

FIG. 3 is a diagram illustrating elements of an offset compensated boosted writeback sense amplifier. Sense amplifier 300 may be part of DRAM memory device 110 and/or sense amplifier stripes 135 (i.e., as sense amplifier 130, in particular.) In FIG. 3, sense amplifier 300 includes functional blocks 310, 320, and 340. Other functional block of sense amplifier 300 have been omitted from FIG. 3 for the sake of brevity. Sense amplifier 300 performs the evaluation of the voltage difference on the true (BLt) and complement (BLc) bitlines. Sense amplifier 300 also performs the writing and/or writeback of data to a memory cell (e.g. cell 123) by forcing (charging) the true (BLt) and complement (BLc) bitlines to either the digital logic supply voltage (VDD) and/or a boosted bitline voltage (VBLHI).

Amplifier block 310 is comprised of a pair of cross-coupled inverters that are switched on by evaluate control block 320. The cross-coupled inverters of amplifier block 310 comprise n-channel field effect transistors (NFETs) 311 and 312, and p-channel field effect transistors (PFETs) 313 and 314. NFET 311 and PFET 314 form a first inverter that is cross-coupled to a second inverter formed using NFET 312 and PFET 314. The outputs of each inverter is provided to the input of the other inverter (i.e., cross-coupled). The negative supply and the positive supply to the inverters of amplifier block 310 are selectively provided by evaluate control block 320.

The power supplies SAN and SAP to these inverters are selectively (switchably) provided to amplifier block 310 by evaluate control block 320 in order to allow the internal and external nodes of/to amplifier block 310 (including the bitlines BLt, BLc, internal nodes SABLt, SABLc, and power supplies SAN and SAP) to be equalized and then activated to evaluate the voltages on the bitlines BLt and BLc. The power supply SAP is selectively (switchably) provided to amplifier block 310 by boosted bitline control block 325. The power supply SAP is selectively (switchably) provided to amplifier block 310 by boosted bitline control block 325 in order to charge the voltage on an amplifier block 310 state dependent one of the bitlines BLt and BLc to the boosted bitline voltage VBLHI.

Evaluate control block 320 includes NFET 321 and PFET 322. NFET 321, under the control of the signal on the NSET node, switchable connects and disconnects the negative (reference) supply voltage to the node SAN (which is the negative supply for amplifier block 210). PFET 322, under the control of the signal on the PSET node, switchable connects and disconnects the digital logic supply voltage VDD to the node SAP (which is the positive supply for amplifier block 310). NFET 321, under the control of the signal on the NSET node, switchable connects and disconnects the negative (reference) supply voltage to the node SAN (which is the negative/reference supply for amplifier block 310. The signal provided to the NSET node (i.e., gate of NFET 321) may have a swing that is less than the bitline voltage. Thus, in normal operation, the control circuitry (e.g., control circuitry 160) coupled to evaluate control block 320 may comprise circuitry that can supply the NSET node with a signal that reaches the digital logic supply voltage VDD but does not reach VBLHI (or even reaches VBLHI minus PFET 322's threshold voltage.)

In an embodiment, in normal operation, the positive supply voltage connected to SAP by PFET 322 is less than the boosted bitline voltage VBLHI. The swing of the signal on PSET (i.e., the gate of PFET 322) may be equal to (or less than a threshold voltage of PFET 322 lower than) the digital logic supply voltage (e.g., VDD) to be connected to SAP. Thus, in normal non-writeback operations, the control circuitry coupled to evaluate control block 320 may comprise circuitry that can supply the PSET node with a signal that reaches the digital logic supply voltage VDD but does not reach VBLHI (or even reaches VBLHI minus PFET 322's threshold voltage.)

Offset compensation switch block 340, when activated via signals on nodes ISO and OC, disconnects the bitlines BLt and BLc from internal amplifier block 310 nodes SABLt and SABLc, respectively; connects BLt to SABLc; and, connects BLc to SABLt. Offset compensation switch block 340 includes NFETs 341-544. The gates of NFETs 341-542 are operatively coupled together and to node ISO (a.k.a., isolate.) The source and drain nodes of NFET 341 are connected to BLt and SABLt, respectively. The source and drain nodes of NFET 342 are connected to BLc and SABLc, respectively. The source and drain nodes of NFET 343 are connected to BLt and SABLc, respectively. The source and drain nodes of NFET 344 are connected to BLc and SABLt, respectively. The swing of the signal on OC (i.e., the gates of NFETs 343-344) may be equal to the digital logic supply voltage VDD. Thus, in normal operation, the control circuitry coupled to offset compensation switch block 340 may comprise circuitry that can supply the OC nodes with signals that at least reach VDD does not reach VBLHI.

In an embodiment, under the control of the signal on the PSETH node, PFET 326 switchably connects and disconnects the boosted bitline voltage VBLHI to the node SAP. PFET 322, under the control of the signal on the PSET node, switchable disconnects the digital logic supply voltage from the node SAP when PFET 326 connects the boosted bitline voltage VBLHI to the node SAP. To disconnect the digital logic supply voltage VDD from the node SAP, the voltage on the PSET node may be boosted to VBLHI. The disconnection of the digital logic supply voltage VDD from the node SAP avoids a drive-fight between the boosted bitline voltage VBLHI and the digital logic supply voltage VDD. When PFET 326 connects the boosted bitline voltage VBLHI to the node SAP, an amplifier block 310 state selected one of the bitlines BLt and BLc are charged to the boosted bitline voltage VBLHI. In an embodiment, PFET 326 connects the boosted bitline voltage VBLHI to the node SAP to evaluate the voltages on the bitlines BLt and BLc. In this embodiment, PFET 326 may connect the boosted bitline voltage VBLHI to the node SAP without first connecting the digital logic supply voltage VDD to the node SAP.

Figure 4A:
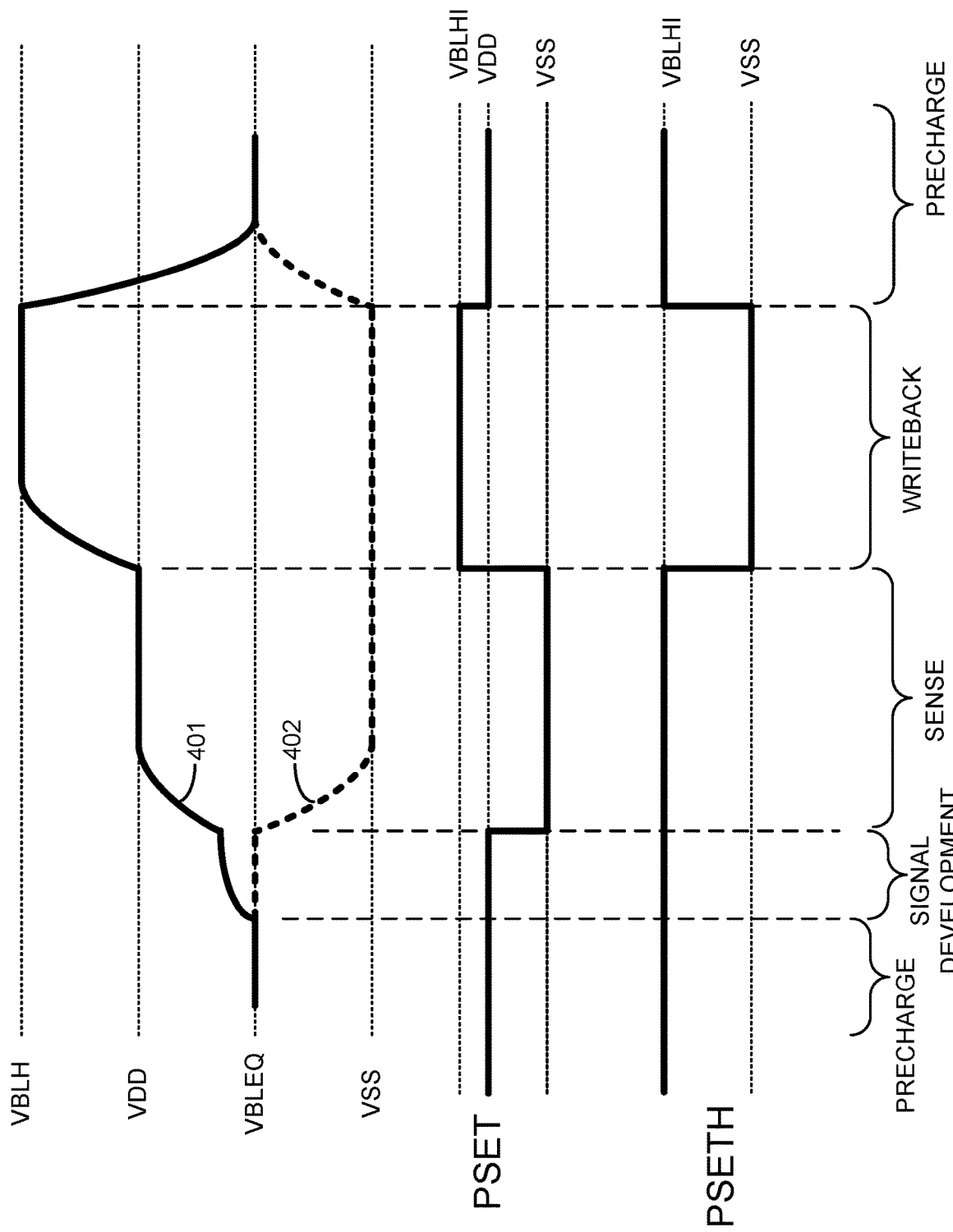
FIGS. 4A-4C are diagrams that illustrate boosted writeback operations.
Figure 4B:
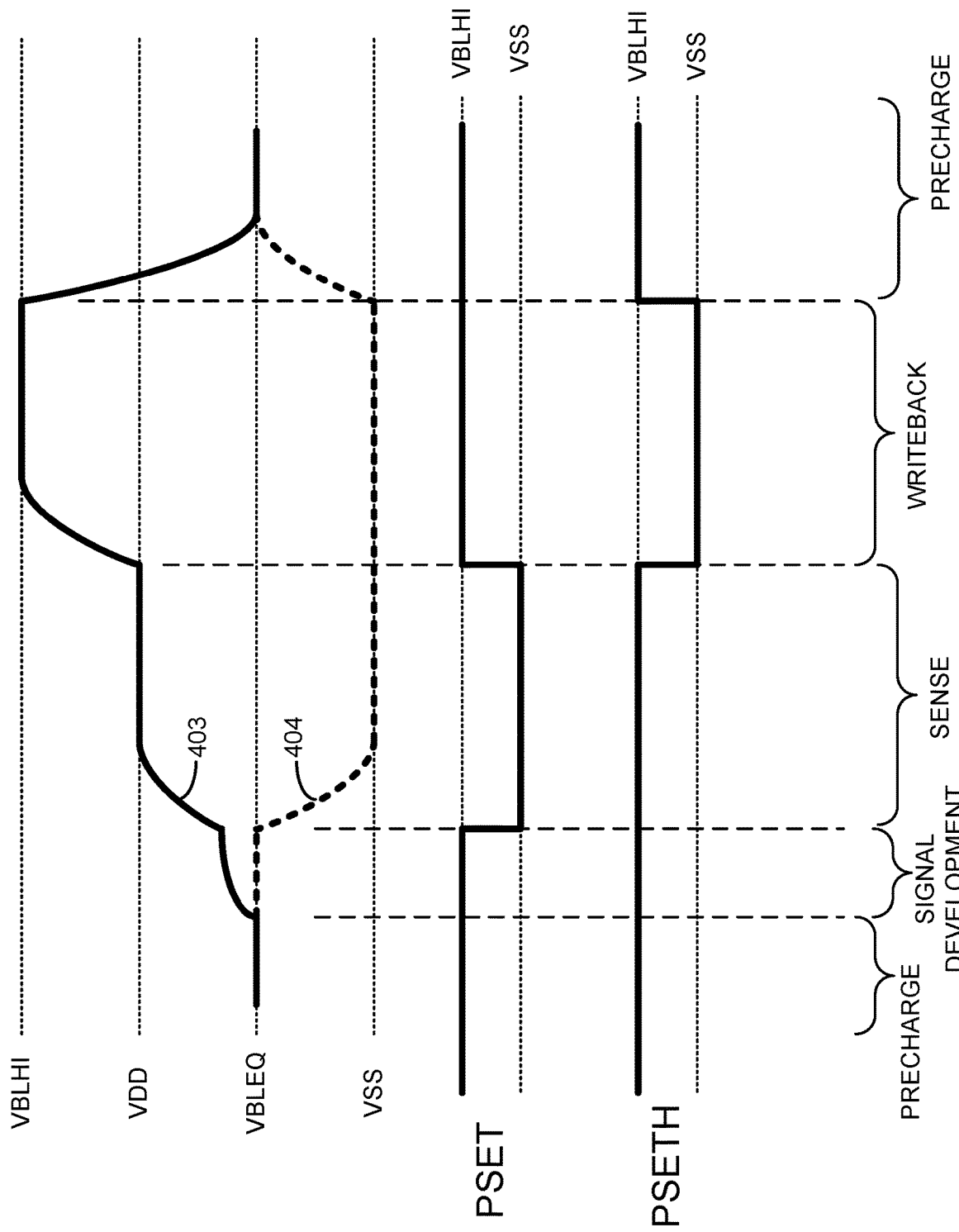
Figure 4C:
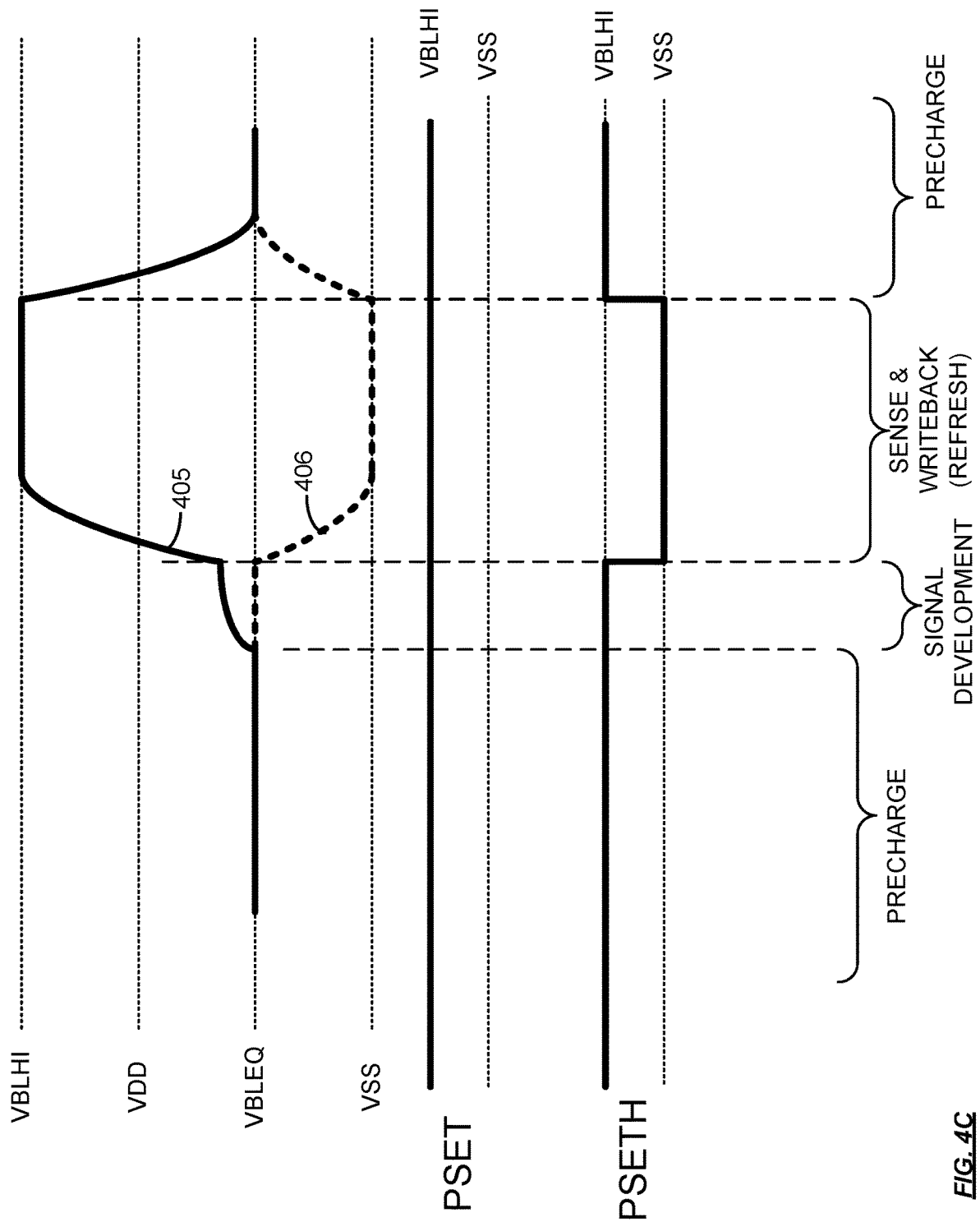
Figure 5:
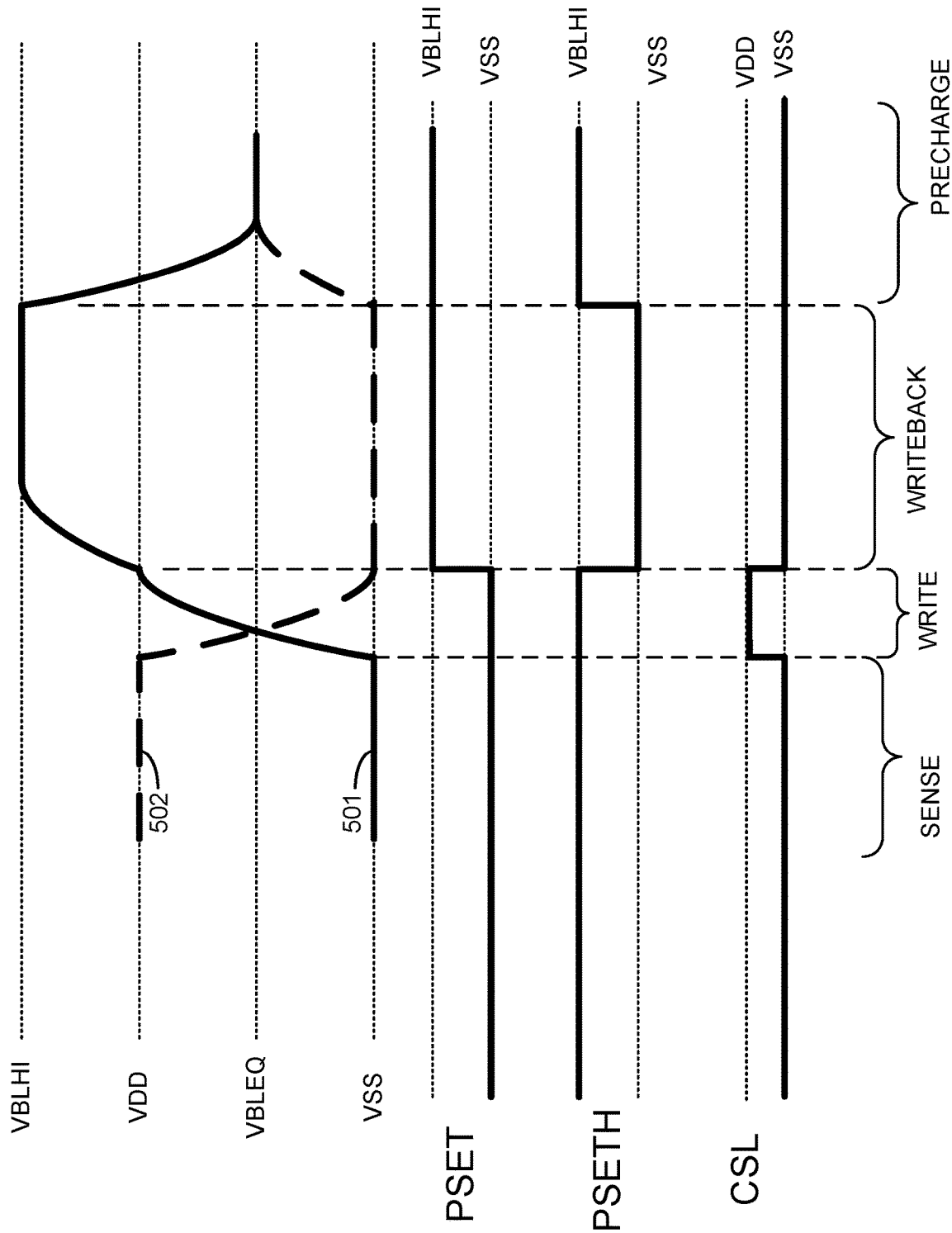
FIG. 5 is a diagram illustrating a boosted voltage write operation.

FIGS. 4A-4C are diagrams that illustrate boosted writeback operations. In general, PSET should be at VBLHI during boosted writeback operations to fully disconnect VBLHI from VDD. This can be achieved by: (1) a two-level operation where PSET is switched between VSS and VBLHI; or, (2) a three-level operation where PSET is switched between 0 and VDD during non-writeback operations, and is boosted to VBLHI during writeback operations. An example three-level operation is illustrated in FIG. 4A. Example two level operations are illustrated in FIGS. 4B, 4C, and 5.

In FIG. 4A, a sense (read) operation is performed followed by a writeback operation. In FIG. 4A, waveforms 401 and 402 represent the voltages on bitlines (e.g., bitlines BLt and BLc of sense amplifier 200.) In a first phase (precharge operation) the waveforms 401-402 illustrate the bitlines are precharged to the same voltage level VBLEQ. VBLEQ may, in some embodiments, be approximately equal to VDD/2. During this first precharge phase, PSET is driven to VDD and PSETH is driven to the boosted bitline voltage VBLHI. This is to allow the bitlines to be charged to VBLEQ which, in FIG. 4A, is less than both VDD and VBLHI.

The next (second) phase is signal development. Signal development is started when the equalization circuitry (e.g., sense amplifier equalize block 230, and bitline equalize block 240) is turned off and the wordline opens while the sense-amp is not yet switched to sense. Signal development shares the charge of the cell with the bitline and separates true and complement bitline slightly to have a signal that is then amplified in the sense phase.

In third phase (sense operation), PSET is driven to the negative reference voltage VSS, and PSETH remains at VBLHI. When PSET is driven to the negative reference voltage, the positive supply node SAP of the amplifier block (e.g., amplifier block 210) of the sense amplifier is connected to VDD. This, along with the negative node being connected to VSS (not shown in FIG. 4A) causes the cross-coupled inverters (e.g., amplifier block 210) of the sense amplifier to evaluate the voltage difference on the bitlines. As the voltage difference is evaluated, the cross-coupled inverters feedback with each other to drive the bitlines according to the voltage difference on the bitlines. This is illustrated in FIG. 4A by waveform 401 charging up to VDD and waveform 402 discharging to VSS.

In a fourth phase (writeback operation), PSET is driven to the boosted bitline voltage VBLHI, and PSETH is driven to the negative reference voltage VSS. This causes VBLHI to be applied to the positive supply node SAP. In response, the waveform 401 illustrates that the bitline that was charged up to VDD further charges up to VBLHI. The waveform 402 illustrates that the bitline that was discharged to VSS remains at VSS. Thus, it can be seen from FIG. 4A, the waveform 401 illustrating the bitline is "boosted" above VDD to VBLHI. The voltage on the bitline illustrated by waveform 401 determines a voltage on the capacitor in a DRAM cell (e.g. cell 123). Thus, the voltage on the capacitor in the DRAM cell is also "boosted."

In a fifth phase (precharge operation), PSETH is driven to the boosted bitline voltage VBLHI and PSET is lowered to VDD. This allows the bitlines to be precharged back to the starting voltage level VBLEQ. This is illustrated in FIG. 4A by the waveforms 401-402 returning to VBLEQ.

In FIG. 4B, a sense (read) operation is performed followed by a writeback operation. In FIG. 4B, waveforms 403 and 404 represent the voltages on bitlines (e.g., bitlines BLt and BLc of sense amplifier 200.) In a first phase (precharge operation) the waveforms 403-404 illustrate the bitlines are precharged to the same voltage level VBLEQ. VBLEQ may, in some embodiments, be approximately equal to VDD/2. During this first precharge phase, PSET and PSETH are driven to the boosted bitline voltage VBLHI. This is to allow the bitlines to be charged to VBLEQ which, in FIG. 4B, is less than both VDD and VBLHI.

The next (second) phase is signal development. In a third phase (sense operation), PSET is driven to the negative reference voltage VSS and PSETH remains at VBLHI. When PSET is driven to the negative reference voltage, the positive supply node SAP of the amplifier block (e.g., amplifier block 210) of the sense amplifier is connected to VDD. This, along with the negative node being connected to VSS (not shown in FIG. 4B) causes the cross-coupled inverters (e.g., amplifier block 210) of the sense amplifier to evaluate the voltage difference on the bitlines. As the voltage difference is evaluated, the cross-coupled inverters feedback with each other to drive the bitlines according to the voltage difference on the bitlines. This is illustrated in FIG. 4B by waveform 403 charging up to VDD and waveform 404 discharging to VSS.

In a fourth phase (writeback operation), PSET is driven to VBLHI and PSETH is driven to the negative reference voltage VSS. This causes the boosted bitline voltage VBLHI to be applied to the positive supply node SAP. In response, the waveform 403 illustrates that the bitline that was charged up to VDD further charges up to VBLHI. The waveform 404 illustrates that the bitline that was discharged to VSS remains at VSS. Thus, it can be seen from FIG. 4B, the waveform 403 illustrating the bitline is "boosted" above VDD to VBLHI. The voltage on the bitline illustrated by waveform 403 determines a voltage on the capacitor in a DRAM cell (e.g. cell 123). Thus, the voltage on the capacitor in the DRAM cell is also "boosted."

In a fifth phase (precharge operation), PSETH and PSET are driven to the boosted bitline voltage VBLHI. This allows the bitlines to be precharged back to the starting voltage level VBLEQ. This is illustrated in FIG. 4B by the waveforms 403-404 returning to VBLEQ.

FIG. 4C, illustrates a boosted bitline voltage refresh operation. In FIG. 4C, waveforms 405 and 406 represent the voltages on bitlines (e.g., bitlines BLt and BLc of sense amplifier 200.) In a first phase (precharge operation) the waveforms 405-406 illustrate the bitlines are precharged to the same voltage level VBLEQ. VBLEQ may, in some embodiments, be approximately equal to VDD/2. During this first precharge phase, PSET and PSETH are driven to VBLHI. The waveforms 405-406 illustrate the bitlines are both charged to VBLEQ which, in FIG. 4C, is less than both VDD and VBLHI.

The next (second) phase is signal development. In a third phase (combination sense and writeback operation), PSET remains driven to VBLHI and PSETH is driven to the negative reference voltage VSS. This causes VBLHI to be applied to the positive supply node SAP. When PSET is driven to the negative reference voltage, the positive supply node SAP of the amplifier block (e.g., amplifier block 210) of the sense amplifier is connected to VBLHI. This, along with the negative node being connected to VSS (not shown in FIG. 4C) causes the cross-coupled inverters (e.g., amplifier block 210) of the sense amplifier to evaluate the voltage difference on the bitlines. As the voltage difference is evaluated, the cross-coupled inverters feedback with each other to drive the waveforms 405-406 according to the voltage difference on the bitlines. This is illustrated in FIG. 4C by waveform 405 charging up to VBLHI and waveform 406 discharging to VSS.

Thus, it can be seen from FIG. 4C, in one operation, the waveform 405 is "boosted" above VDD to VBLHI. The voltage on bitline illustrated by waveform 405 determines a voltage on the capacitor in a DRAM cell (e.g. cell 123). Thus, the voltage on the capacitor in the DRAM cell is also "boosted." In a fourth phase (precharge operation), PSETH is driven to the boosted bitline voltage VBLHI and PSET remains at VBLHI. This allows the waveforms 405-406 to be precharged back to the starting voltage level VBLEQ.

FIG. 5 is a diagram illustrating a boosted voltage write operation. In FIG. 5, waveforms 501 and 502 represent the voltages on bitlines (e.g., bitlines BLt and BLc of sense amplifier 200.) In a first phase (end of sense operation) the waveforms 501-502 illustrate the bitlines are charged to VSS and VDD, respectively. The state of the bitlines may have been determined by a previous sense or write operation that set the state of the inverters in the amplifier block (e.g., amplifier block 210). At the end of this phase, PSET is being driven to VSS, PSETH is being driven to VBLHI, and column select line CSL is driven to VSS. This is to allow the bitline illustrated by waveform 501 to be charged up to VDD but not as high as VBLHI. This also prevents the voltages on the local data lines from overwriting the state of the inverters in the amplifier block.

In a second phase (write operation), PSET remains at VSS, and PSETH remains at VBLHI, and a column select line (CSL) is driven to VDD. When CSL is driven to VDD, the voltages on the local data lines overwrite the state of the inverters in the amplifier block. This is illustrated in FIG. 5 by waveform 501 charging up to VDD and waveform 502 discharging to VSS.

In a third phase (writeback operation), PSET is driven to VBLHI, PSETH is driven to the negative reference voltage VSS, and CSL is driven to VSS. This causes VBLHI to be applied to the positive supply node SAP. In response, the waveform 501 that was charged up to VDD further charges up to VBLHI. The waveform 502 that was discharged to VSS remains at VSS. Thus, it can be seen from FIG. 5, the waveform 501 is "boosted" above VDD to VBLHI. The voltage on waveform 501 determines a voltage on the capacitor in a DRAM cell (e.g. cell 123). Thus, the voltage on the capacitor in the DRAM cell is also "boosted."

In a fourth phase (precharge operation), PSETH is driven to the boosted bitline voltage VBLHI, PSET remains at VBLHI, and CSL remains at VSS. This allows the bitlines illustrated by waveforms 501-502 to be precharged back to the starting voltage level VBLEQ.

Figure 6:
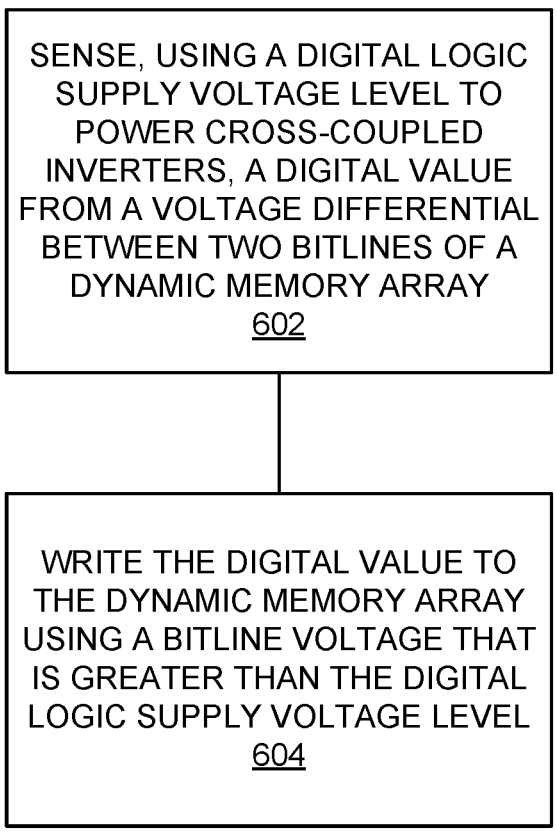
FIG. 6 is a flowchart illustrating a boosted writeback method.

FIG. 6 is a flowchart illustrating a boosted writeback method. One or more steps illustrated in FIG. 6 may be performed by, for example, memory system 100, sense amplifier 200, sense amplifier 300, and/or their components. Using a digital logic supply voltage level to power cross-coupled inverters, a digital value is sensed from a voltage differential between two bitlines of a dynamic memory array (602). For example, using the digital logic supply voltage VDD to power the cross-coupled inverters of amplifier block 210, sense amplifier 200 may use a voltage differential between the true (BLt) and complement (BLc) bitlines connected to sense amplifier 200 to sense a digital value corresponding to that voltage differential.

The digital value is written to the dynamic memory array using a bitline voltage that is greater than the digital logic supply voltage level (604). For example, boosted bitline control block of sense amplifier 200 may couple a boosted bitline voltage VBLHI that is greater than VDD to the positive supply node SAP of amplifier block 210. This allows a one of the cross-coupled inverters of amplifier block 210 to drive the boosted bitline voltage VBLHI into the dynamic memory array (e.g., subarray 128) where the boosted bitline voltage VBLHI will charge the capacitor of a dynamic memory array cell (e.g., cell 123.)

Figure 7:
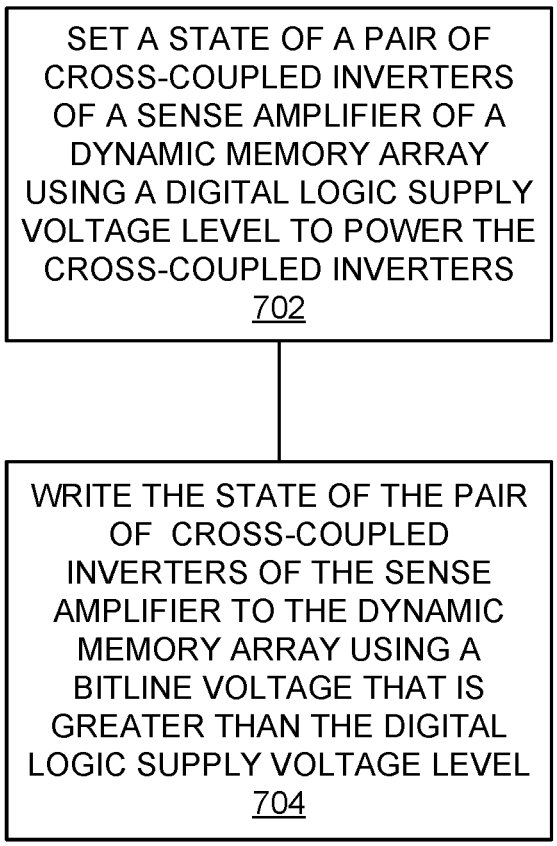
FIG. 7 is a flowchart illustrating a boosted write method.

FIG. 7 is a flowchart illustrating a boosted write method. One or more steps illustrated in FIG. 7 may be performed by, for example, memory system 100, sense amplifier 200, sense amplifier 300, and/or their components. A state of a pair of cross-coupled inverters of a sense amplifier of a dynamic memory array is set using a digital logic supply voltage level to power the cross-coupled inverters (702). For example, during a write operation which sets their state based on voltages on local data lines LDQt and LDQc, the cross-coupled inverters of amplifier block 210 of sense amplifier 200 may be powered by a VDD level voltage from evaluate control block 320.

The state of the pair of cross-coupled inverters of the sense amplifier is written to the dynamic memory array using a bitline voltage that is greater than the digital logic supply voltage level (704). For example, based on the state of the cross-coupled inverters, sense amplifier 200 may drive a boosted bitline voltage VBLHI that is greater than VDD to a one of the true (BLt) and complement (BLc) bitlines corresponding to the state of the cross-coupled inverters. This allows sense amplifier 200 to drive the boosted bitline voltage VBLHI into the dynamic memory array (e.g., subarray 128) where the boosted bitline voltage VBLHI will charge the capacitor of a dynamic memory array cell (e.g., cell 123.)

Figure 8:
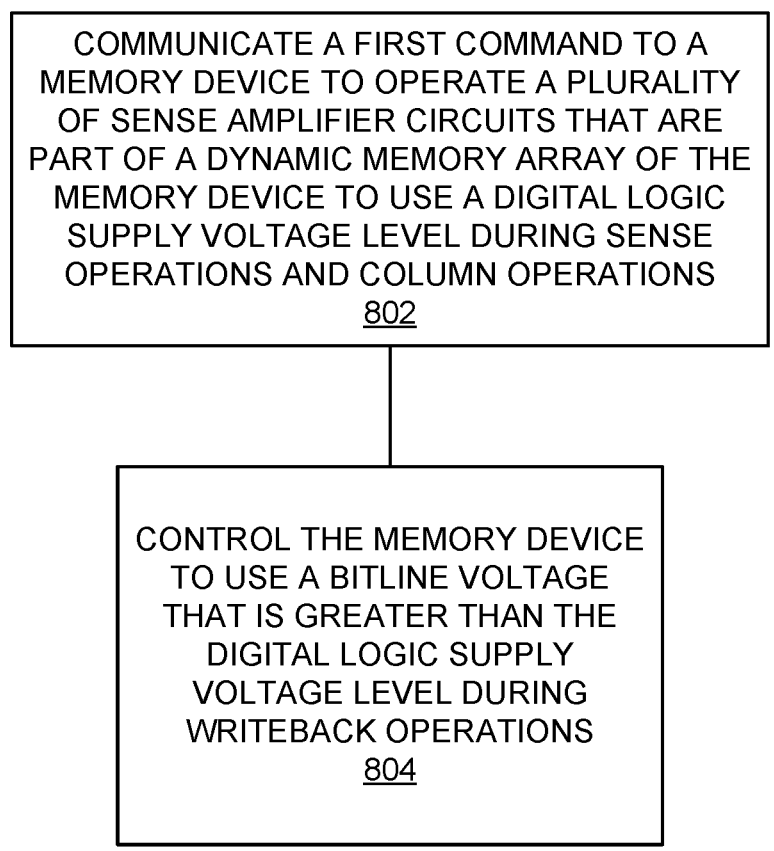
FIG. 8 is a method of operating a memory device.

FIG. 8 is a method of operating a memory device. One or more steps illustrated in FIG. 8 may be performed by, for example, memory system 100 and/or its components. A first command is communicated to a memory device to operate a plurality of sense amplifier circuits that are part of a dynamic memory array of the memory device to use a digital logic supply voltage level during sense operations and column operations (802). For example, controller 180 may communicate, via interface 185, a command (and/or sets a register value) that causes memory device 110 to configure sense amplifiers 130 to sense the state of memory bit cells (e.g., cell 123) using the digital logic supply voltage level (e.g., VDD) and/or maximum signal swing level (with respect to the same negative supply/reference/substrate voltage as the bitline voltage is referenced to) that is used by a majority of the digital logic on DRAM memory device 110.

During writeback operations, the memory device is controlled to use a bitline voltage that is greater than the digital logic supply voltage (804). For example, controller 180 may communicate, via interface 185, a command (and/or sets a register value) that causes memory device 110 to configure sense amplifiers 130 to writeback the state of memory bit cells (e.g., cell 123) using boosted bitline supply (e.g. VBLHI) and/or maximum signal swing level (with respect to the same negative supply/reference/substrate voltage as the digital logic supply voltage level is referenced to) that is greater than the digital logic supply voltage level used by a majority of the digital logic on DRAM memory device 110.

Figure 9:
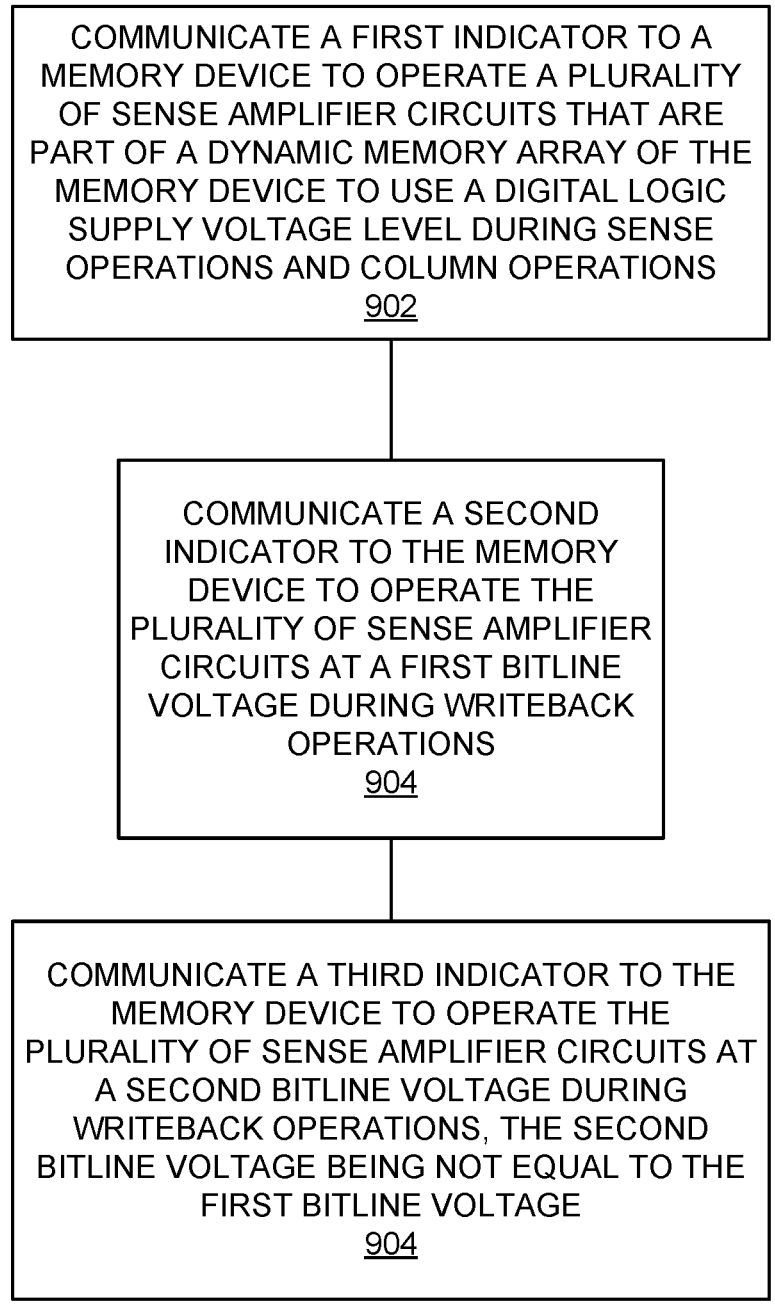
FIG. 9 is a method of adjusting a writeback voltage.

FIG. 9 is a method of adjusting a writeback voltage. One or more steps illustrated in FIG. 9 may be performed by, for example, memory system 100 and/or its components. A first command is communicated to a memory device to operate a plurality of sense amplifier circuits that are part of a dynamic memory array of the memory device to use a digital logic supply voltage level during sense operations and column operations (902). For example, controller 180 may communicate, via interface 185, a register value (and/or a command) that causes memory device 110 to configure sense amplifiers 130 to sense the state of memory bit cells (e.g., cell 123) using the digital logic supply voltage level (e.g., VDD) and/or maximum signal swing level (with respect to the same negative supply/reference/substrate voltage as the bitline voltage is referenced to) that is used by a majority of the digital logic on DRAM memory device 110.

A second indicator is communicated to the memory device to operate the plurality of sense amplifier circuits at a first bitline voltage during writeback operations (904). For example, controller 180 may communicate, via interface 185, a register value (and/or a command) that causes memory device 110 to configure sense amplifiers 130 to writeback the state of memory bit cells (e.g., cell 123) using boosted bitline supply (e.g. VBLHI) and/or maximum signal swing level.

A third indicator is communicated to the memory device to operate the plurality of sense amplifier circuits at a second bitline voltage during writeback operations, where the second bitline voltage is not equal to the first bitline voltage (904). For example, controller 180 may communicate, via interface 185, a register value (and/or a command) that causes memory device 110 to configure sense amplifiers 130 to writeback the state of memory bit cells (e.g., cell 123) using different boosted bitline supply and/or maximum signal swing level. In another example, controller 180 may communicate, via interface 185, a register value (and/or a command) that causes memory device 110 to change the voltage level of VBLHI.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of memory system 100, sense amplifier 200, sense amplifier 300, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 10:
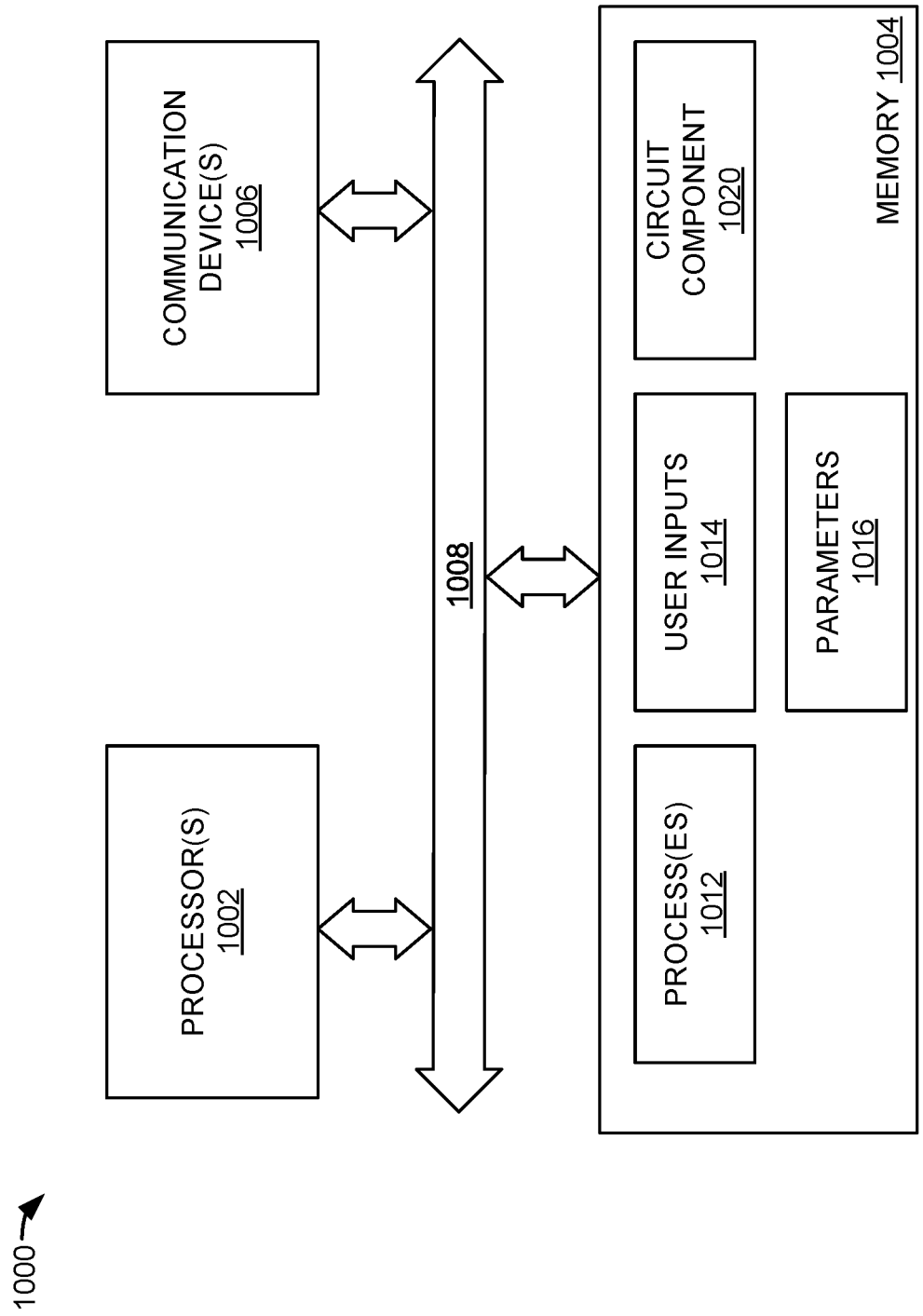
FIG. 10 is a block diagram of a processing system.

FIG. 10 is a block diagram illustrating one embodiment of a processing system 1000 for including, processing, or generating, a representation of a circuit component 1020. Processing system 1000 includes one or more processors 1002, a memory 1004, and one or more communications devices 1006. Processors 1002, memory 1004, and communications devices 1006 communicate using any suitable type, number, and/or configuration of wired and/or wireless connections 1008.

Processors 1002 execute instructions of one or more processes 1012 stored in a memory 1004 to process and/or generate circuit component 1020 responsive to user inputs 1014 and parameters 1016. Processes 1012 may be any suitable electronic design automation (EDA) tool or portion thereof used to design, simulate, analyze, and/or verify electronic circuitry and/or generate photomasks for electronic circuitry. Representation 1020 includes data that describes all or portions of memory system 100, sense amplifier 200, sense amplifier 300, and their components, as shown in the Figures.

Representation 1020 may include one or more of behavioral, register transfer, logic component, transistor, and layout geometry-level descriptions. Moreover, representation 1020 may be stored on storage media or communicated by carrier waves.

Data formats in which representation 1020 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1014 may comprise input parameters from a keyboard, mouse, voice recognition interface, microphone and speakers, graphical display, touch screen, or other type of user interface device. This user interface may be distributed among multiple interface devices. Parameters 1016 may include specifications and/or characteristics that are input to help define representation 1020. For example, parameters 1016 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1004 includes any suitable type, number, and/or configuration of non-transitory computer-readable storage media that stores processes 1012, user inputs 1014, parameters 1016, and circuit component 1020.

Communications devices 1006 include any suitable type, number, and/or configuration of wired and/or wireless devices that transmit information from processing system 1000 to another processing or storage system (not shown) and/or receive information from another processing or storage system (not shown). For example, communications devices 1006 may transmit circuit component 1020 to another system. Communications devices 1006 may receive processes 1012, user inputs 1014, parameters 1016, and/or circuit component 1020 and cause processes 1012, user inputs 1014, parameters 1016, and/or circuit component 1020 to be stored in memory 1004.

Implementations discussed herein include, but are not limited to, the following examples:

Example 1: A dynamic random access memory (DRAM) device, comprising: digital logic circuitry to at least process column addresses and row addresses to retrieve data stored in a dynamic memory array, the digital logic circuitry to operate using a first digital logic supply voltage level; and, sense amplifier circuits that are part of the dynamic memory array to operate using the first digital logic supply voltage level during sense operations and column operations and to operate, during writeback operations, using a boosted bitline voltage that is greater than the first digital logic supply voltage level.

Example 2: The DRAM device of example 1, wherein the digital logic circuitry is implemented using a high-k metal gate process.

Example 3: The DRAM device of example 1, wherein the sense amplifier circuits include a pair of cross-coupled inverters in a bi-stable flip-flop configuration coupled to respective bitlines of the dynamic memory array, the pair of cross-coupled inverters each having a negative supply node and a positive supply node.

Example 4: The DRAM device of example 3, wherein the boosted bitline voltage is selectively coupled to the positive supply node of the pair of cross-coupled inverters during writeback operations.

Example 5: The DRAM device of example 4, wherein the first digital logic supply voltage level is selectively coupled to the positive supply node of the pair of cross-coupled inverters during sense operations and column operations.

Example 6: The DRAM device of example 4, wherein the boosted bitline voltage is selectively coupled to the positive supply node of the pair of cross-coupled inverters during refresh operations.

Example 7: The DRAM device of example 4, wherein the boosted bitline voltage is selectively coupled to the positive supply node of the pair of cross-coupled inverters using a p-channel field effect transistor (PFET) having a PFET gate node to be controlled using logic that applies voltages to the PFET gate node that at least reach the boosted bitline voltage minus a threshold voltage of the PFET.

Example 8: A dynamic random access memory (DRAM) device, comprising: sense amplifier circuits that are part of a dynamic memory array to operate using a first digital logic supply voltage level during a first plurality of sense operations and a first plurality of column operations and to operate, during a first plurality of writeback operations that occur after respective ones of the first plurality of sense operations to writeback data sensed by the respective ones of the first plurality of sense operations, using a first bitline voltage that is greater than the first digital logic supply voltage level; and, digital logic to at least process received commands, column addresses, and row addresses to retrieve data stored in the dynamic memory array, the digital logic to operate using the first digital logic supply voltage level.

Example 9: The DRAM of example 8, wherein the first bitline voltage is based on a first received command.

Example 10: The DRAM of example 9, wherein the sense amplifier circuits are to, based on a second received command, and during a writeback operation that occurs after a sense operation to writeback data sensed by the sense operation, operate using a second bitline voltage that is equal to the first digital logic supply voltage level.

Example 11: The DRAM of example 9, wherein the sense amplifier circuits are to, based on a second received command, and during a writeback operation that occurs after a sense operation to writeback data sensed by the sense operation, operate using a second bitline voltage that is not equal to the first bitline voltage and is greater than or equal to the first digital logic supply voltage level.

Example 12: The DRAM of example 10, wherein the second bitline voltage is based on a temperature of the DRAM.

Example 13: The DRAM of example 8, wherein the sense amplifier circuits are to, based on a first received command, precharge respective bitlines of the dynamic memory array to a precharge voltage that is derived from the first digital logic supply voltage level.

Example 14: The DRAM of example 8, wherein the sense amplifier circuits are to, based on a first received command, perform refresh operations using a second bitline voltage that is equal to the first digital logic supply voltage level.

Example 15: A memory controller, comprising: a command interface to communicate a first indicator and a second indicator to a memory device, based at least on the first indicator, the memory device to operate a plurality of sense amplifier circuits that are part of a dynamic memory array of the memory device using a first digital logic supply voltage level during a first sense operation and a first column operation and to operate, during a first writeback operation that occurs after the first sense operation to writeback data sensed by the first sense operation, using a first bitline voltage that is greater than the first digital logic supply voltage level, the memory device to, based at least on the second indicator, to operate, during a second writeback operation that occurs after a second sense operation to writeback data sensed by the second sense operation, using a second bitline voltage that is equal to the first digital logic supply voltage level; and, a data interface to receive data sensed by the respective ones of the first plurality of sense operations.

Example 16: The memory controller of example 15, wherein the first indicator is based on a command.

Example 17: The memory controller of example 15, wherein the command interface is to communicate a third indicator to the memory device, the memory device to, based on the third indicator, and during a third writeback operation that occurs after a third sense operation, operate the plurality of sense amplifier circuits using a third bitline voltage that is not equal to the first bitline voltage and is greater than or equal to the first digital logic supply voltage level to writeback data sensed by the third sense operation.

Example 18: The memory controller of example 15, wherein the third indicator is based on a command.

Example 19: The memory controller of example 15, wherein the first bitline voltage is based on a temperature of the memory device.

Example 20: The memory controller of example 17, wherein the third bitline voltage is based on a temperature of the memory device.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A dynamic random access memory (DRAM) device, comprising:
   digital logic circuitry to at least process column addresses and row addresses to retrieve data stored in a dynamic memory array, the digital logic circuitry to operate using a first digital logic supply voltage level; and,
   sense amplifier circuits that are part of the dynamic memory array to operate using the first digital logic supply voltage level during column operations and sense operations until a pair of cross-coupled inverters of the sense amplifier circuits reach a stable state using the first digital logic supply voltage and to operate, during writeback operations after the pair of cross-coupled inverters reach the stable state using the first digital logic supply voltage, using a boosted bitline voltage that is greater than the first digital logic supply voltage level.

2. The DRAM device of claim 1, wherein the digital logic circuitry is implemented using a high-k metal gate process.

3. The DRAM device of claim 1, wherein the pair of cross-coupled inverters are in a bi-stable flip-flop configuration coupled to respective bitlines of the dynamic memory array, the pair of cross-coupled inverters each having a negative supply node and a positive supply node.

4. The DRAM device of claim 3, wherein the boosted bitline voltage is selectively coupled to the positive supply node of the pair of cross-coupled inverters during writeback operations.

5. The DRAM device of claim 4, wherein the first digital logic supply voltage level is selectively coupled to the positive supply node of the pair of cross-coupled inverters during sense operations and column operations.

6. The DRAM device of claim 4, wherein the boosted bitline voltage is selectively coupled to the positive supply node of the pair of cross-coupled inverters during refresh operations.

7. The DRAM device of claim 4, wherein the boosted bitline voltage is selectively coupled to the positive supply node of the pair of cross-coupled inverters using a p-channel field effect transistor (PFET) having a PFET gate node to be controlled using logic that applies voltages to the PFET gate node that at least reach the boosted bitline voltage minus a threshold voltage of the PFET.

8. A dynamic random access memory (DRAM) device, comprising:
sense amplifier circuits that are part of a dynamic memory array to operate using a first digital logic supply voltage level during a first plurality of column operations and a first plurality of sense operations that lasts at least until a pair of cross-coupled inverters of the sense amplifier circuits reach a stable state using the first digital logic supply voltage, and to operate, during a first plurality of writeback operations that occur after respective ones of the first plurality of sense operations to writeback data sensed by the respective ones of the first plurality of sense operations, using a first bitline voltage that is greater than the first digital logic supply voltage level; and,
digital logic to at least process received commands, column addresses, and row addresses to retrieve data stored in the dynamic memory array, the digital logic to operate using the first digital logic supply voltage level.

9. The DRAM of claim 8, wherein the first bitline voltage is based on a first received command.

10. The DRAM of claim 9, wherein the sense amplifier circuits are to, based on a second received command, and during a writeback operation that occurs after a sense operation to writeback data sensed by the sense operation, operate using a second bitline voltage that is equal to the first digital logic supply voltage level.

11. The DRAM of claim 9, wherein the sense amplifier circuits are to, based on a second received command, and during a writeback operation that occurs after a sense operation to writeback data sensed by the sense operation, operate using a second bitline voltage that is not equal to the first bitline voltage and is greater than or equal to the first digital logic supply voltage level.

12. The DRAM of claim 10, wherein the second bitline voltage is based on a temperature of the DRAM.

13. The DRAM of claim 8, wherein the sense amplifier circuits are to, based on a first received command, precharge respective bitlines of the dynamic memory array to a precharge voltage that is derived from the first digital logic supply voltage level.

14. The DRAM of claim 8, wherein the sense amplifier circuits are to, based on a first received command, perform refresh operations using a second bitline voltage that is equal to the first digital logic supply voltage level.

15. A memory controller, comprising:
a command interface to communicate a first indicator and a second indicator to a memory device, based at least on the first indicator, the memory device to operate a plurality of sense amplifier circuits that are part of a dynamic memory array of the memory device using a first digital logic supply voltage level during a first column operation and a first sense operation that lasts at least until cross-coupled inverters of the plurality of sense amplifier circuits reach stable states using the first digital logic supply voltage, and to operate, during a first writeback operation that occurs after the first sense operation reaches the stable states using the first digital logic supply voltage to writeback data sensed by the first sense operation, using a first bitline voltage that is greater than the first digital logic supply voltage level, the memory device to, based at least on the second indicator, to operate, during a second writeback operation that occurs after a second sense operation reaches the stable states using the first digital logic supply voltage to writeback data sensed by the second sense operation, using a second bitline voltage that is equal to the first digital logic supply voltage level; and,
a data interface to receive data sensed by the respective ones of the first plurality of sense operations.

16. The memory controller of claim 15, wherein the first indicator is based on a command.

17. The memory controller of claim 15, wherein the command interface is to communicate a third indicator to the memory device, the memory device to, based on the third indicator, and during a third writeback operation that occurs after a third sense operation reaches the stable states using the first digital logic supply voltage, operate the plurality of sense amplifier circuits using a third bitline voltage that is not equal to the first bitline voltage and is greater than or equal to the first digital logic supply voltage level to writeback data sensed by the third sense operation.

18. The memory controller of claim 15, wherein the third indicator is based on a command.

19. The memory controller of claim 15, wherein the first bitline voltage is based on a temperature of the memory device.

20. The memory controller of claim 17, wherein the third bitline voltage is based on a temperature of the memory device.

* * * * *